(12) United States Patent
Harnishfeger et al.

(10) Patent No.: US 9,106,327 B2
(45) Date of Patent: *Aug. 11, 2015

(54) SYSTEM AND METHOD FOR CORRECTING INTEGRAL NONLINEARITY IN AN OSCILLATOR SYSTEM

(71) Applicant: Intel IP Corporation, Santa Clara, CA (US)

(72) Inventors: David Harnishfeger, Chandler, AZ (US); Kris K. Kaufman, Gilbert, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/478,402

(22) Filed: Sep. 5, 2014

(65) Prior Publication Data

US 2014/0378073 A1 Dec. 25, 2014

Related U.S. Application Data

(63) Continuation of application No. 13/489,988, filed on Jun. 6, 2012, now Pat. No. 8,855,579.

(51) Int. Cl.
| | |
|---|---|
| *H04B 1/40* | (2006.01) |
| *H04B 17/00* | (2015.01) |
| *H03J 1/00* | (2006.01) |
| *H04B 1/405* | (2015.01) |
| *H04B 17/11* | (2015.01) |

(52) U.S. Cl.
CPC .......... *H04B 17/0005* (2013.01); *H03J 1/0008* (2013.01); *H04B 1/40* (2013.01); *H04B 1/405* (2013.01); *H04B 17/11* (2015.01); *H03J 2200/05* (2013.01); *H03J 2200/09* (2013.01)

(58) Field of Classification Search
USPC ........ 455/75, 120, 73, 147, 113; 331/176, 44, 331/141, 19, 16, 178, 34, 158, 186, 25; 341/120, 144, 118, 136, 143, 157
See application file for complete search history.

(56) References Cited

U.S. PATENT DOCUMENTS

| | | |
|---|---|---|
| 5,594,439 A | 1/1997 | Swanson |
| 5,594,612 A | 1/1997 | Henrion |

(Continued)

OTHER PUBLICATIONS

Notice of Allowance received for U.S. Appl. No. 13/489,988 mailed on Jun. 6, 2014, 10 pages.

*Primary Examiner* — Ganiyu A Handidu
(74) *Attorney, Agent, or Firm* — Baker Botts L.L.P.

(57) ABSTRACT

A method may include measuring a frequency difference between an actual frequency and an expected frequency associated with a frequency control calibration signal value for each of a plurality of frequency control calibration signal values during a calibration phase. The method may additionally include generating integral non-linearity compensation values based on the frequency differences measured. The method may further include generating the applied frequency control signal based on a frequency control calibration signal value received by the digital-to-analog converter during the calibration phase. The method may also include generating a compensated frequency control signal value based on a frequency control signal value received by the integral non-linearity compensation module and an integral non-linearity compensation value associated with the frequency control signal value during an operation phase of the wireless communication element.

10 Claims, 4 Drawing Sheets

(56) References Cited

U.S. PATENT DOCUMENTS

| | | |
|---|---|---|
| 6,933,788 B2 | 8/2005 | Forrester |
| 7,046,098 B2 * | 5/2006 | Staszewski ............... 331/158 |
| 7,148,760 B2 * | 12/2006 | Vaananen .................. 331/25 |
| 7,714,665 B2 * | 5/2010 | Waheed et al. ............. 331/16 |
| 8,346,188 B2 | 1/2013 | Subburaj et al. |
| 2003/0095011 A1 | 5/2003 | Fry et al. |
| 2004/0146132 A1 * | 7/2004 | Staszewski et al. ........... 375/376 |
| 2006/0033582 A1 * | 2/2006 | Staszewski et al. ............ 331/16 |
| 2007/0188243 A1 * | 8/2007 | Waheed et al. ............. 331/16 |
| 2007/0188244 A1 * | 8/2007 | Waheed et al. ............. 331/16 |
| 2008/0125990 A1 | 5/2008 | Chang |
| 2012/0045000 A1 | 2/2012 | Simmons et al. |
| 2012/0046005 A1 | 2/2012 | Simmons et al. |
| 2012/0206209 A1 | 8/2012 | Kaufman et al. |

* cited by examiner

SYSTEM AND METHOD FOR CORRECTING INTEGRAL NONLINEARITY IN AN OSCILLATOR SYSTEM

RELATED APPLICATION

This application is a Continuation of U.S. patent application Ser. No. 13/489,988 filed Jun. 6, 2012, which is incorporated herein by reference in its entirety.

TECHNICAL FIELD

The present disclosure relates generally to wireless communication and, more particularly, to correcting integral non-linearity in a voltage-controller temperature compensated oscillator system.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Transmitters, receivers, and transceivers often include components known as oscillators. An oscillator may serve many functions in a transmitter, receiver, and/or transceiver, including generating local oscillator signal (usually in a radio-frequency range) for upconverting baseband signals onto a radio-frequency (RF) carrier and performing modulation for transmission of signals, and/or for downconverting RF signals to baseband signals and performing demodulation of received signals.

To achieve desired functionality, wireless communications elements must often have designs that produce precise operating characteristics. For example, it is often critical that oscillator circuits in wireless communication elements operate independently of the temperature of the oscillator circuit, to prevent variations in temperature from leading to undesired variations in the frequency of oscillation of an oscillator circuit. Accordingly, temperature compensated oscillator circuits have been employed to provide for temperature-independent operation. As another example, it is often critical that oscillator circuits avoid other effects, including integral non-linearity (INL) occurring in digital-to-analog converters associated with an oscillator. In general, integral nonlinearity is a term describing the maximum deviation between the ideal output of a DAC and the actual output level (after offset and gain errors have been removed). The term is often used as an important specification for measuring error in a digital-to-analog converter.

In many wireless communication elements, the overall effective INL experienced by a DAC used in a frequency control circuit in a wireless communication elements is often dependent upon the composite of the voltage linearity of the DAC and the voltage to frequency linearity of an oscillator (e.g., a voltage controlled temperature compensated crystal oscillator) driven by the DAC. In many cases, designers of the DAC and other components of the wireless communication element may desire to reduce the overall effective INL, but may have no control over the voltage to frequency linearity of an associated oscillator (e.g., the oscillator may be manufactured or provided by a party other than the DAC designer).

SUMMARY

A method may include estimating an actual frequency of a digital receiver signal for each of a plurality of frequency control calibration signal values during a calibration phase of a wireless communication element, estimate an actual frequency of a digital receiver signal. The method may also include measuring a frequency difference between the actual frequency and an expected frequency associated with the frequency control calibration signal value for each of the plurality of frequency control calibration signal values during the calibration phase. The method may additionally include generating integral non-linearity compensation values based on the frequency differences measured for the plurality of frequency control calibration signal values during the calibration phase, each integral non-linearity compensation value associated with a corresponding possible frequency control signal value. The method may further include generating the applied frequency control signal based on a frequency control calibration signal value received by the digital-to-analog converter during the calibration phase. The method may also include generating a compensated frequency control signal value based on a frequency control signal value received by the integral non-linearity compensation module and an integral non-linearity compensation value associated with the frequency control signal value during an operation phase of the wireless communication element. The method may additionally include generating the applied frequency control signal based on the compensated frequency control signal value generated by the integral non-linearity compensation module during the operation phase.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
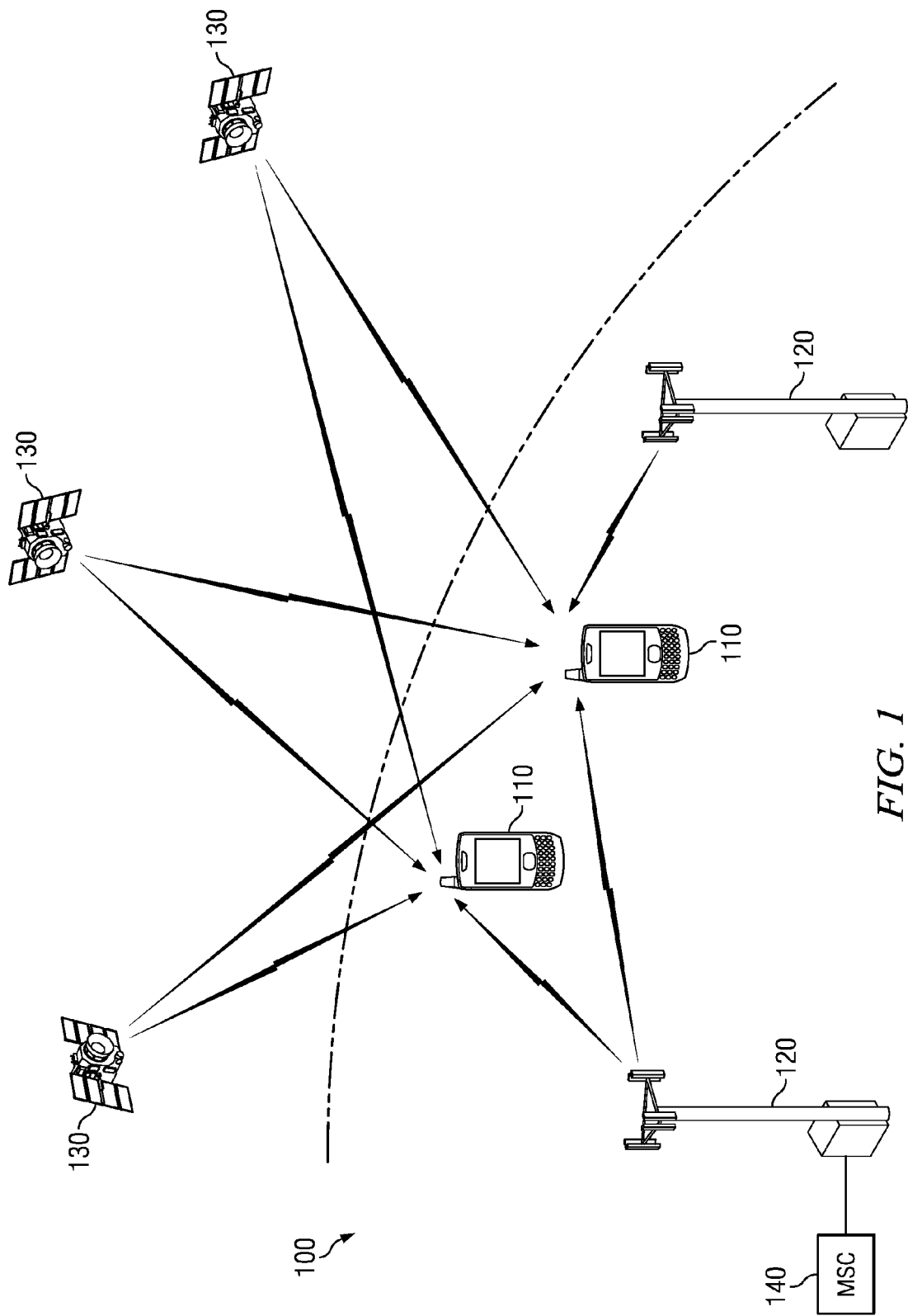
FIG. 1 illustrates a block diagram of an example wireless communication system, in accordance with embodiments of the present disclosure.

FIG. 1 illustrates a block diagram of an example wireless communication system 100, in accordance with embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
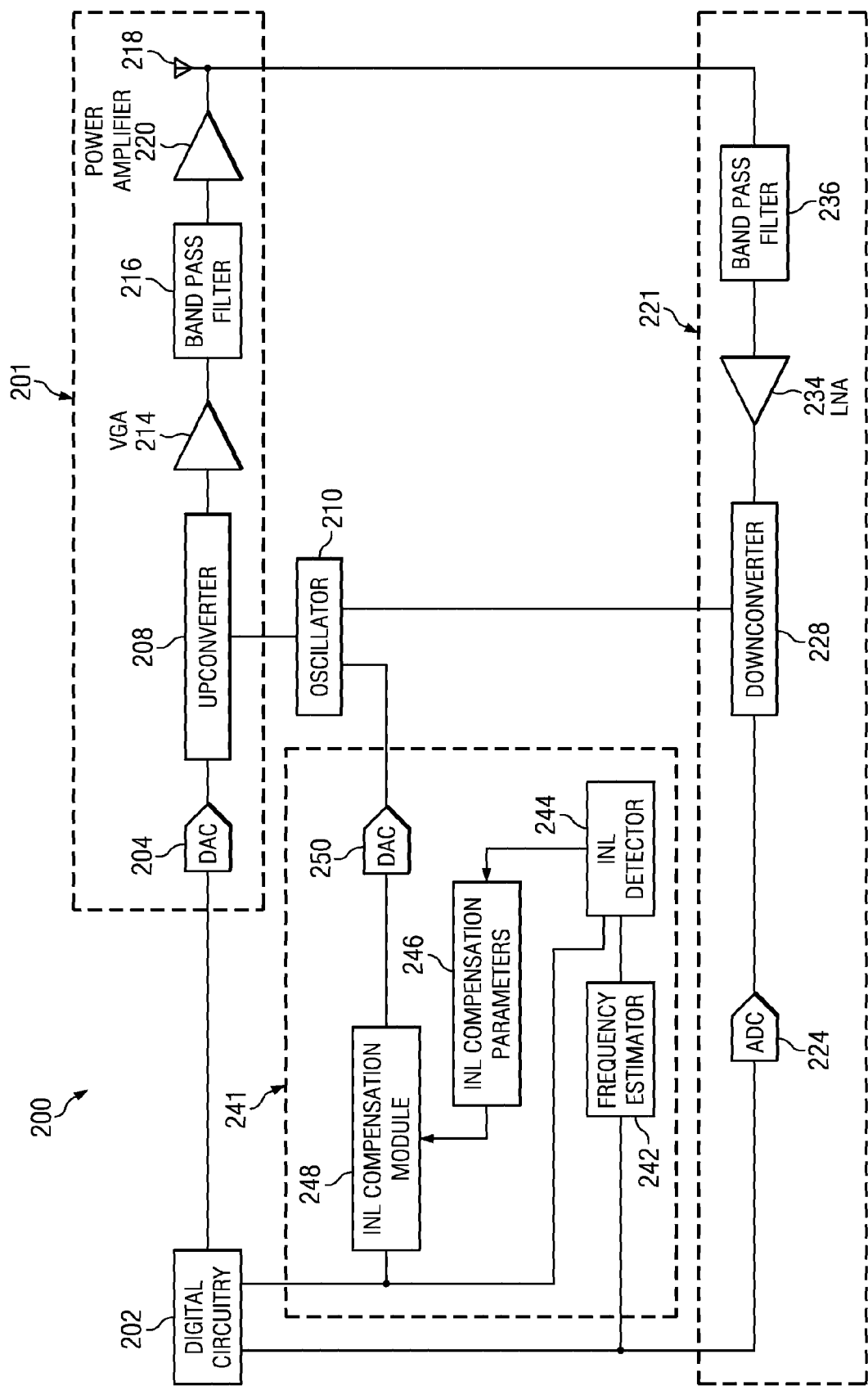
FIG. 2 illustrates a block diagram of selected components of an example wireless communication element, in accordance with embodiments of the present disclosure.

FIG. 2 illustrates a block diagram of selected components of an example wireless communication element 200 (e.g., a terminal 110, a base station 120, or a satellite 130), in accordance with embodiments of the present disclosure. Element 200 may include a transmit path 201, a receive path 221, and a frequency control path 241. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, configured to process signals and information for transmission via transmit path 201, and/or process signals and information for use by frequency control path 241. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. Oscillator 210 may operate at an operating frequency based on an analog control signal received from frequency control path 241. In some embodiments, oscillator 210 may be a voltage-controlled crystal oscillator. In these embodiments, oscillator 210 may be a voltage-controlled, temperature-compensated crystal oscillator (VCTCXO).

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 234 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). In addition, receive path 221 may include an analog-to-digital converter (ADC) 224 configured to receive an analog signal from downconverter 228 and convert such analog signal into a digital signal. Such digital signal may then be passed to digital circuitry 202 for processing.

Frequency control path 241 may generally be operable to control frequency of oscillator 210 based on a control signal communicated to frequency control path 241 by digital circuitry 202. In some embodiments, frequency control path 241 may comprise an automatic frequency control system, and in such embodiments the control signal communicated to frequency control path 241 by digital circuitry 202 may comprise an automatic frequency control (AFC) code. As shown in FIG. 2, frequency control path 241 may include frequency estimator 242, INL detector 244, INL compensation parameters 246, INL compensation module 248, and DAC 250.

Frequency estimator 242 may comprise any system, device, or apparatus configured to, during a calibration phase of element 200, receive a digital signal from receive path 221 and estimate the frequency of the signal using any suitable technique in the relevant art for extracting a frequency from a digital signal. INL detector 244 may comprise any system, device, or apparatus configured to, during the calibration phase, and based on the estimated frequency determined by frequency estimator 242 and a frequency control signal (e.g., AFC code) received from digital circuitry 202, detect a difference between the estimated frequency and the expected frequency associated with the frequency control signal. As will be appreciated by those of skill in the art, the detected difference between the estimated frequency and the expected frequency is indicative a composite integral nonlinearity contributed by DAC 250, oscillator 210, and/or other components of element 200.

In operation, during a calibration phase of element 200 (e.g., occurring during "factory phasing" of element 200 prior to delivery to an intended end user), frequency estimator 242 and INL detector 244 may operate in concert to calculate INL at a plurality of operating frequencies as described in greater detail below. Based on such calculations, INL detector 244 may generate INL compensation parameters 246 to be applied to INL compensation module 248 during operation of element 200 (e.g., while in operation by an intended end user), also as described in greater detail below.

INL compensation parameters 246 may comprise any list, map, table, database, or any other suitable data structure for storing and/or computing a plurality of INL compensation parameters. In some embodiments, INL compensation parameters 246 may comprise a plurality of entries, wherein each entry may include a particular frequency control signal value (e.g., AFC code) and a compensated frequency control signal value (e.g., compensated AFC code) associated with the particular frequency control signal value. Thus, INL compensation parameters 246 may take the form of a look-up table, in which an entry in the table may be addressed by the frequency control signal value. In some embodiments, INL compensation parameters may be modified after factory phasing (e.g., after delivery to end user). For example, in some embodiments, updated parameters may be communicated (e.g., via wireless connection) in a manner similar to a firmware update. In these and other embodiments, the calibration phase described herein may be repeated to again calculate INL at various frequencies (e.g., to account for aging of an oscillator over time).

INL compensation module 248 may comprise any system, device, or apparatus configured to, based on a received frequency control signal from digital circuitry 202 and a compensation parameter associated with such frequency control signal stored in INL compensation parameters 246, generate a compensated frequency control signal for communication to DAC 250. In embodiments in which the frequency control signal is an AFC code, the compensated frequency control signal may comprise a compensated AFC code based on the received AFC code and an INL compensation parameter associated with the received AFC code. During calibration of element 200 (e.g., occurring during "factory phasing" of element 200 prior to delivery to an intended end user), INL compensation module 248 may be bypassed (e.g., such that the frequency control signal from digital circuitry 202 is passed to DAC 250) or may configured to pass the frequency control signal from digital circuitry 202 unmodified, such that calibration may occur and INL compensation parameters 246 for use during normal operation of element 200 may be created.

DAC 250 may comprise any suitable digital-to-analog converter for receiving a frequency control signal and/or or compensated frequency control signal in digital form and converting such frequency control signal to an analog frequency control signal indicative of an operating frequency for oscillator 210.

Figure 3:
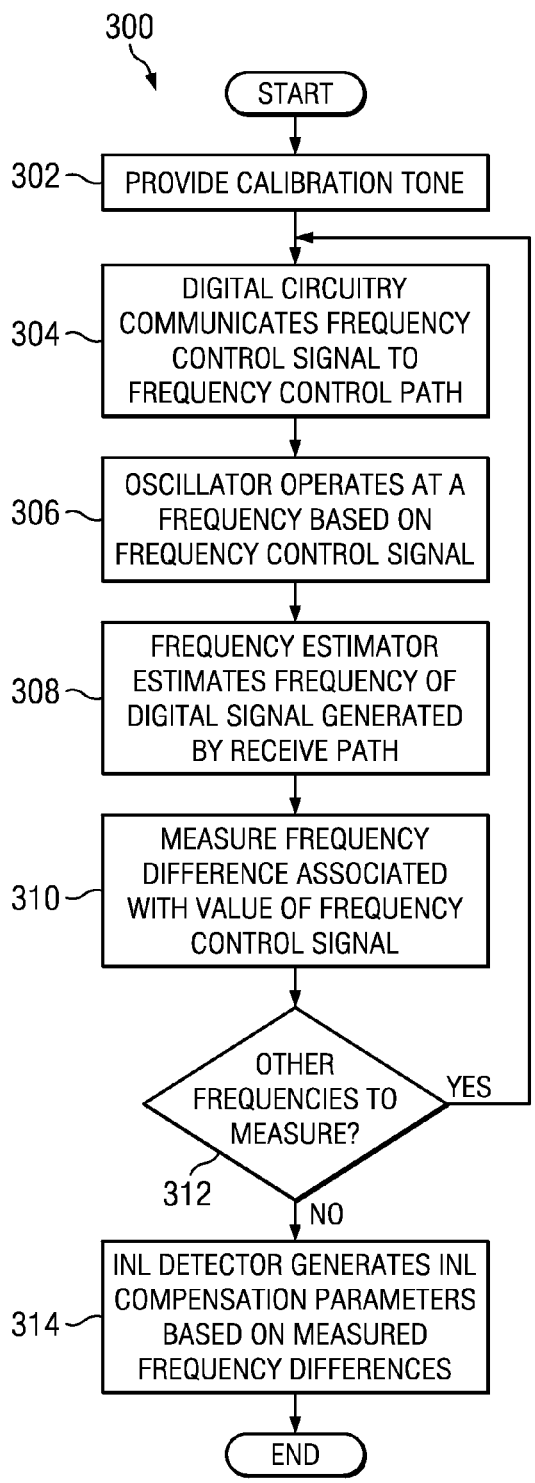
FIG. 3 illustrates a flow chart of an example method for calibrating a frequency control path of a wireless communication element, in accordance with embodiments of the present disclosure.

FIG. 3 illustrates a flow chart of an example method 300 for calibrating frequency control path 241, in accordance with embodiments of the present disclosure. According to one embodiment, method 300 may begin at operation 302. As noted above, teachings of the present disclosure may be implemented in a variety of configurations of element 200. As such, the preferred initialization point for method 300 and the order of the operations 302-314 comprising method 300 may depend on the implementation chosen.

At operation 302, a calibration tone may be provided to an antenna (e.g., antenna 218) or other portion of receive path 221 for purposes of calibrating a frequency control path (e.g., frequency control path 241). In some embodiments such calibration may take place during factory phasing of the wireless communication element, prior to delivery to the intended end user of the wireless communication element.

At operation 304, digital circuitry (e.g., digital circuitry 202) may communicate a frequency control signal (e.g., an AFC code) associated with a particular operating frequency to the frequency control path. A DAC (e.g., DAC 250) of the frequency control path may convert the frequency control signal into an analog frequency control signal and communicate such analog frequency control signal to an oscillator (e.g., oscillator 210) of the wireless communication element.

At operation 306, the oscillator may operate at a frequency based on the analog frequency control signal. Due to integral nonlinearity of the oscillator, the DAC, and/or other components of the wireless communication element, the actual frequency of operation may be different than an expected operating frequency associated with the frequency control signal provided by the digital circuitry. Based on the oscillation signal output by the oscillator, a downconverter (e.g., downconverter 228) may downconvert the calibration tone received at the antenna, and an ADC (e.g., ADC 224) may convert the downcoverter calibration tone into a digital receiver calibration signal.

Figure 4:
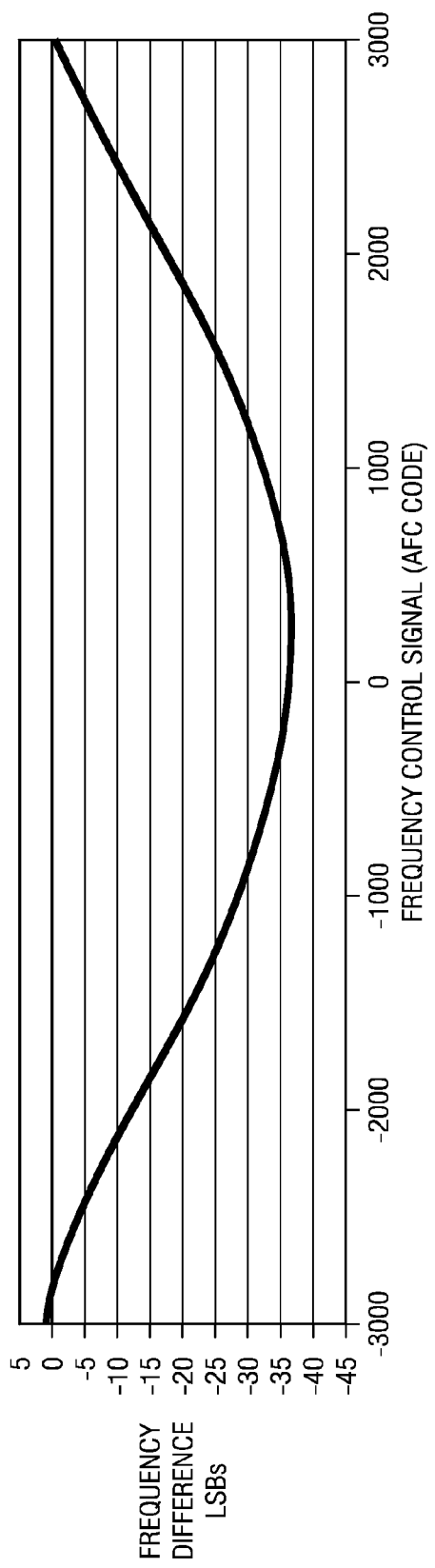
FIG. 4 illustrates an example graph of frequency difference versus frequency control signal in an uncompensated wireless communication element, in accordance with embodiments of the present disclosure.

At operation 308, a frequency estimator (e.g., frequency estimator 242) of the frequency control path may estimate the frequency of the digital receiver calibration signal. At operation 310, an INL detector (e.g., INL detector 244) may determine the frequency difference between estimated frequency and the expected frequency associated with the frequency control signal provided by the digital circuitry. To further illustrate operation 310 and the functionality of the INL detector, reference is made to FIG. 4, which illustrates an example graph of frequency difference versus frequency control signal in an uncompensated wireless communication element, as may occur during calibration, in accordance with embodiments of the present disclosure. As shown in FIG. 4, for certain values of the frequency control signal, the frequency difference (depicted in FIG. 4 in terms of least significant bits (LSBs) of the frequency control signal) between estimated frequency and expected frequency may vary, thus illustrating INL. In operation 310, the INL detector may calculate, for the relevant frequency control signal (e.g., as depicted in the x-axis of FIG. 4) the frequency difference occurring as the result of INL (e.g., as depicted in the y-axis of FIG. 4).

At operation 312, a component (e.g. digital circuitry) of the wireless communication device may determine if more frequencies are to be tested by frequency control path 241 for calibration. While it may be impractical to test each possible frequency control signal, testing at a plurality of frequency control signals may provide for enough data points such that suitable compensation for frequency control signals that are not tested may be inferred by interpolation, as described in greater detail below. If more frequencies are to be tested, method 300 may return to operation 304, and operations 304-310 may be repeated for each frequency control signal to be tested. If no more frequencies are to be tested, method 300 may proceed to operation 314.

Figure 5:
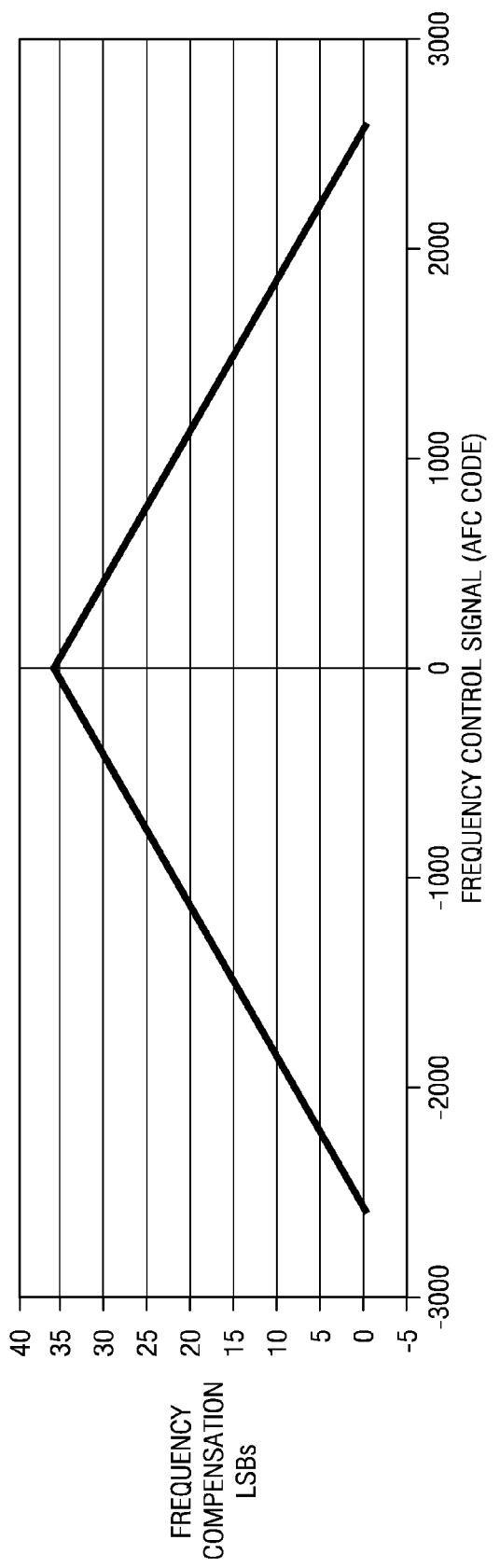
FIG. 5 illustrates an example graph of an example integral nonlinearity compensation function, in accordance with embodiments of the present disclosure.

At operation 314, INL detector may generate INL compensation parameters (e.g., INL compensation parameters 246) based on the measured frequency differences, each INL compensation parameter associated with a corresponding frequency control signal value, which is indicative of a correction or compensation to applied to such corresponding frequency control signal in order that the frequency control path may compensate for the calculated frequency difference. Such compensation parameter may be stored as part of a list, map, table, or other data structure (e.g., INL compensation parameters 246). To further illustrate operation 314 and the functionality of the INL detector, reference is made to FIG. 5, which illustrates an example graph of an example integral nonlinearity compensation function, in accordance with embodiments of the present disclosure. As shown in FIG. 5, for each possible values of the frequency control signal, a compensation parameter amount may be applied (depicted in FIG. 5 in terms of least significant bits (LSBs) of the frequency control signal). To generate the function depicted in FIG. 5, a plurality of data points may be taken during calibration, a frequency difference may be measured for each data point, and interpolation may be used to generate a compensation parameter amount for each possible frequency control signal value. For example, in FIG. 5, data points are taken at the endpoints of the range of possible frequency control signal values and at a midpoint of the range, and compensation parameter amount for each possible frequency control signal value by interpolating between adjacent data points. While FIG. 5 shows three sample data points used to generate INL compensation parameters, any suitable number of data points may be used. For example, in some embodiments, the number of data points selected may be such that no two consecutive data points vary by a threshold amount (e.g., one part per million).

After completion of operation 314, method 300 may end.

Although FIG. 3 discloses a particular number of operations to be taken with respect to method 300, method 300 may be executed with greater or lesser operations than those depicted in FIG. 3. In addition, although FIG. 3 discloses a certain order of operations to be taken with respect to method 300, the operations comprising method 300 may be completed in any suitable order.

Method 300 may be implemented using element 200 or any other system operable to implement method 300. In certain embodiments, method 300 may be implemented partially or fully in software and/or firmware embodied in computer-readable media.

Figure 6:
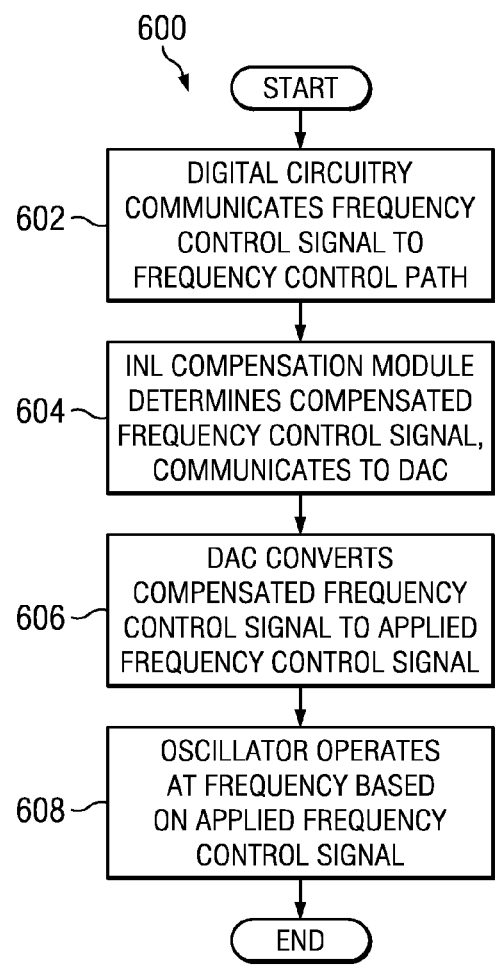
FIG. 6 illustrates a flow chart of an example method for compensating for integral nonlinearity in a wireless communication element, in accordance with embodiments of the present disclosure.

FIG. 6 illustrates a flow chart of an example method 600 for compensating for integral nonlinearity in wireless communication element 200, in accordance with embodiments of the present disclosure. According to one embodiment, method 600 may begin at operation 602. As noted above, teachings of the present disclosure may be implemented in a variety of configurations of element 200. As such, the preferred initialization point for method 600 and the order of the operations 602-612 comprising method 600 may depend on the implementation chosen.

At operation 602, digital circuitry (e.g., digital circuitry 202) may communicate a frequency control signal (e.g., an AFC code) associated with a particular operating frequency to the frequency control path (e.g. frequency control path 241). At operation 604, an INL compensation module (e.g., INL compensation module 248), may reference INL compensation parameters (e.g., INL compensation parameters generated during calibration) to determine a compensated frequency control signal value (e.g., a compensated AFC code) based on the frequency control signal communicated from the digital circuitry. For example, the INL compensation module may look up in the INL compensation parameters a compensated frequency control signal value associated with the frequency control signal value received by the INL compensation module.

At operation 606, a DAC (e.g., DAC 250) of the frequency control path may convert the compensated frequency control signal into an applied frequency control signal and communicate such applied frequency control signal to an oscillator (e.g., oscillator 210) of the wireless communication element. At operation 608, the oscillator may operate at a frequency based on the applied frequency control signal. After completion of step 608, method 600 may end.

Although FIG. 6 discloses a particular number of operations to be taken with respect to method 600, method 600 may be executed with greater or lesser operations than those depicted in FIG. 6. In addition, although FIG. 6 discloses a certain order of operations to be taken with respect to method 600, the operations comprising method 600 may be completed in any suitable order.

Method 600 may be implemented using element 200 or any other system operable to implement method 600. In certain embodiments, method 300 may be implemented partially or fully in software and/or firmware embodied in computer-readable media.

A component of network wireless communication device 200 may include an interface, logic, memory, and/or other suitable element. An interface receives input, sends output, processes the input and/or output, and/or performs other suitable operations. An interface may comprise hardware and/or software.

Logic performs the operations of the component, for example, executes instructions to generate output from input. Logic may include hardware, software, and/or other logic. Logic may be encoded in one or more tangible computer readable storage media and may perform operations when executed by a computer. Certain logic, such as a processor, may manage the operation of a component. Examples of a processor include one or more computers, one or more microprocessors, one or more applications, and/or other logic.

A memory stores information. A memory may comprise one or more tangible, computer-readable, and/or computer-executable storage medium. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Modifications, additions, or omissions may be made to wireless communication device 200 from the scope of the disclosure. The components of wireless communication device 200 may be integrated or separated. Moreover, the operations of wireless communication device may be performed by more, fewer, or other components. As used in this document, "each" refers to each member of a set or each member of a subset of a set.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could me made hereto without departing from the spirit and scope of the invention.

What is claimed is:

1. A wireless communication element, comprising:
   a receive path configured to receive a first wireless communication signal and convert the first wireless communication signal into a first digital signal based at least on an oscillator signal;
   a transmit path configured to convert a second digital signal into a second wireless communication signal based at least on the oscillator signal and transmit the second wireless communication signal;
   an oscillator configured to output the oscillator signal to at least one of the receive path and the transmit path, the oscillator configured to operate at an operating frequency based on an applied frequency control signal; and
   a frequency control path configured to generate the applied frequency control signal, the frequency control path comprising:
      an integral non-linearity compensation module configured to generate a compensated frequency control signal value based on a received frequency control signal value received by the integral non-linearity compensation module and an integral non-linearity compensation value associated with the received frequency control signal value; and
      a digital-to-analog converter configured to generate the applied frequency control signal based on the compensated frequency control signal value generated by the integral non-linearity compensation module.

2. The wireless communication element of claim 1, wherein the integral non-linearity compensation module is further configured to read the integral non-linearity compensation value from a table.

3. The wireless communication element of claim 2, wherein the table comprises the integral non-linearity compensation value and a corresponding stored frequency control signal value.

4. The wireless communication element of claim 1, wherein the received frequency control signal value is an automatic frequency control code.

5. The wireless communication element of claim 1, wherein the compensated frequency control signal value is an automatic frequency control code.

6. A method comprising:
   receiving a first wireless communication signal and converting the first wireless communication signal into a first digital signal based at least on an oscillator signal;
   converting a second digital signal into a second wireless communication signal based at least on the oscillator signal and transmitting the second wireless communication signal;
   providing the oscillator signal to at least one of the receive path and the transmit path, the oscillator signal having a frequency based on an applied frequency control signal;
   generating a compensated frequency control signal value based on a frequency control signal value received by the integral non-linearity compensation module and an integral non-linearity compensation value associated with the frequency control signal value during an operation phase of the wireless communication element; and
   generating the applied frequency control signal based on the compensated frequency control signal value generated by the integral non-linearity compensation module during the operation phase.

7. The method of claim 6, further comprising reading the integral non-linearity compensation values from a table.

8. The method of claim 7, wherein the table comprises the integral non-linearity compensation value and a corresponding stored frequency control signal value.

9. The method of claim 6, wherein the frequency control signal value is an automatic frequency control code.

10. The method of claim 6, wherein the compensated frequency control signal value is an automatic frequency control code.

* * * * *